(12) United States Patent
Tseng et al.

(10) Patent No.: US 11,137,296 B2
(45) Date of Patent: Oct. 5, 2021

(54) FORCE SENSOR WITH MEMS-BASED DEVICE AND FORCE TOUCHING MEMBER

(71) Applicant: MIRAMEMS SENSING TECHNOLOGY CO., LTD, Suzhou Industrial Park (CN)

(72) Inventors: Li-Tien Tseng, Taoyuan (TW); Yu-Hao Chien, Taipei (TW); Chih-Liang Kuo, Hsinchu (TW); Yu-Te Yeh, Hsinchu (TW)

(73) Assignee: MIRAMEMS SENSING TECHNOLOGY CO., LTD, Suzhou (CN)

( * ) Notice: Subject to any disclaimer, the term of this patent is extended or adjusted under 35 U.S.C. 154(b) by 0 days.

(21) Appl. No.: 16/426,463

(22) Filed: May 30, 2019

(65) Prior Publication Data

US 2019/0368951 A1   Dec. 5, 2019

(30) Foreign Application Priority Data

May 30, 2018   (CN) .......................... 201810537745.X

(51) Int. Cl.
   *G01L 1/14*   (2006.01)
   *B81B 3/00*   (2006.01)
(52) U.S. Cl.
   CPC ............ *G01L 1/142* (2013.01); *B81B 3/0072* (2013.01); *B81B 2203/0376* (2013.01); *B81B 2203/0392* (2013.01)

(58) Field of Classification Search
   CPC .......... B81B 7/0051; B81B 2201/0264; B81B 2207/07; B81B 2207/012; G01L 1/148; B81C 2203/0785; B81C 2203/031; B81C 2203/0792; B81C 1/00301
   See application file for complete search history.

(56) References Cited

U.S. PATENT DOCUMENTS

| 8,154,115 | B1 * | 4/2012 | Chan ...................... B81B 7/007 257/704 |
| 2013/0127001 | A1 * | 5/2013 | Wen ....................... H01L 25/167 257/432 |
| 2015/0259196 | A1 * | 9/2015 | Nakamura ............ B81B 7/0038 257/415 |
| 2017/0343430 | A1 * | 11/2017 | Caltabiano ................ G01L 1/04 |
| 2018/0086626 | A1 * | 3/2018 | Le Neal .................. B81C 3/005 |
| 2019/0330053 | A1 * | 10/2019 | Tseng .................... B81B 7/0077 |

* cited by examiner

*Primary Examiner* — Brandi N Hopkins
(74) *Attorney, Agent, or Firm* — Muncy, Geissler, Olds & Lowe, P.C.

(57) ABSTRACT

A force sensor includes a package substrate, a MEMS-based device, a package body and a force touching member. The MEMS-based device is disposed on the package substrate and electrically connected with the package substrate. The package body encapsulates the MEMS-based device. The force touching member including a rod is disposed on the package body and corresponding to the MEMS-based device. The force sensor allows a greater assembly tolerance.

8 Claims, 7 Drawing Sheets

FORCE SENSOR WITH MEMS-BASED DEVICE AND FORCE TOUCHING MEMBER

BACKGROUND OF THE INVENTION

1. Field of the Invention

The present invention relates to a force sensor, particularly to a force sensor allowing a greater assembly tolerance.

2. Description of the Prior Art

Since the concept of the microelectromechanical system (MEMS) emerged in 1970s, MEMS devices have evolved from the targets explored in laboratories into the objects integrated with high-level systems. Nowadays, MEMS-based devices have been extensively used in consumer electronics, and the application thereof is still growing stably and fast. A MEMS-based device includes a mobile MEMS component. The function of a MEMS-based device may be realized through measuring the physical magnitude of the movement of the MEMS component. The force sensor is an example of MEMS devices, able to detect a pressing action and/or a pressing force.

The existing force sensors include the piezoresistor type pressure sensor and the capacitor type pressure sensor. Refer to FIG. 1. In a conventional piezoresistor type pressure sensor, a plurality of piezoresistors 12 is disposed on a mobile membrane 11. While a pressing force causes the mobile membrane 11 to deform, the piezoresistors 12 generate corresponding signals. Refer to FIG. 2. A conventional capacitor type pressure sensor includes a mobile membrane 21 and a fixed electrode 22, and the mobile membrane 21 is disposed opposite to the fixed electrode 22, whereby is formed a sensing capacitor. The signals generated by the sensing capacitor are transmitted to an Application Specific Integrated Circuit (ASIC) chip (not shown in the drawing) through a lead and processed by the ASIC chip. It is easily understood: a package body 23 is needed to package and protect the abovementioned components. A pressing force is conducted through the package body 23 to cause the deformation of the mobile membrane 21 and make the sensing capacitor output corresponding signals.

Refer to FIG. 2 and FIG. 3. Based on the abovementioned structures, while forces of the same magnitude are applied to different contact positions on the pressure sensor, the pressure sensor will output different sensation signals respectively according to the contact positions. For example, as the contact position of the force F1 is nearer to the center of the pressure sensor, the mobile membrane 11 will generate a greater deformation. Thus, the pressure sensor outputs a greater sensation signal. The contact positions of the force F2 and the force F3 are farther from the center of the pressure sensor. Even though the forces F2 and F3 are identical to the force F1, they cause smaller deformations of the mobile membrane 11 and generate smaller output sensation signals. The fact that the forces of the same magnitude generate different output sensation signals is unfavorable to the succeeding processing and treatment of the signals. In order to make the output sensation signals more consistent, the manufacturers solve the problem via limiting the position of the pressing element to a smaller area close to the center of the pressure sensor. However, such a measure causes assembly difficulty and decreases assembly reliability. Accordingly, the industry is eager to develop a force sensor allowing a greater assembly tolerance.

SUMMARY OF THE INVENTION

A force sensor is provided therein, wherein a force touching member is disposed on the package body opposite to the MEMS-based device, whereby the contact of a pressing element and the force touching member makes the pressing force concentrated on the force touching member, wherefore the force sensor of the present invention can endure a greater assembly tolerance.

In one embodiment, the force sensor of the present invention comprises a package substrate, a MEMS-based device, a package body and a force touching member. The MEMS-based device is disposed on the package substrate and electrically connected with the package substrate. The package body encapsulates the MEMS-based device. The force touching member includes a rod, disposed on the package body and corresponding to the MEMS-based device.

Below, embodiments are described in detail in cooperation with the attached drawings to make easily understood the objectives, technical contents, characteristics and accomplishments of the present invention.

DESCRIPTION OF THE PREFERRED EMBODIMENTS

Figure 1:
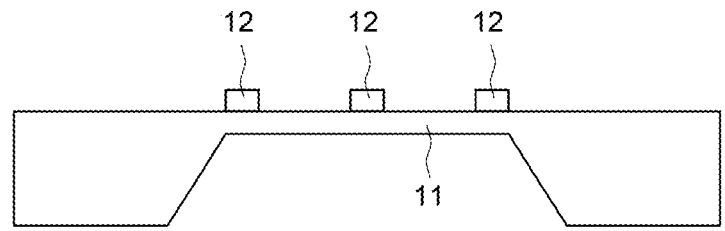
FIG. 1 is a diagram schematically showing a conventional piezoresistor type pressure sensor.
Figure 2:
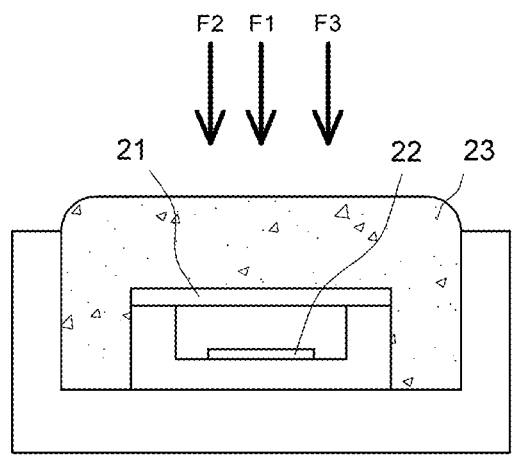
FIG. 2 is a diagram schematically showing a conventional capacitor type pressure sensor.
Figure 3:
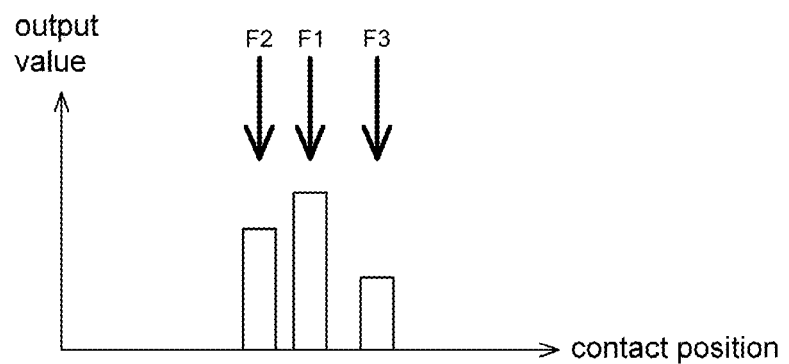
FIG. 3 is a diagram schematically showing the output signals corresponding to different contact positions of a conventional force sensor.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Figure 4:
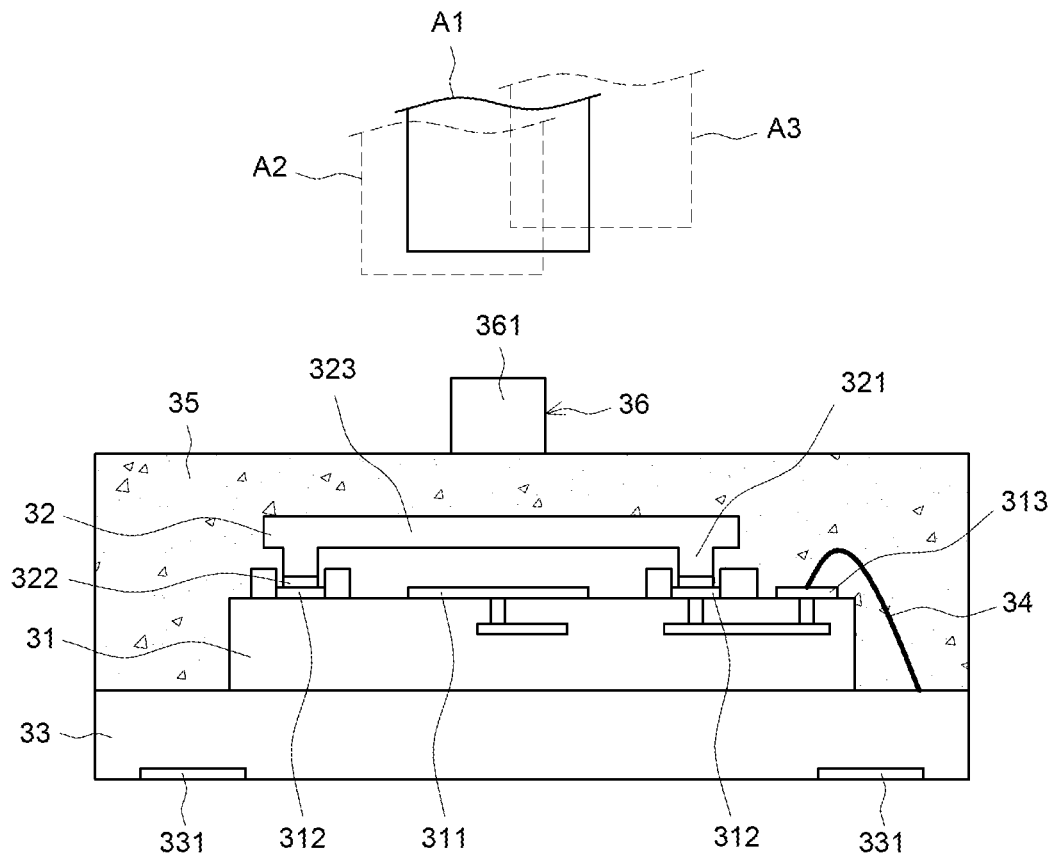
FIG. 4 is a diagram schematically showing a force sensor according to a first embodiment of the present invention.

Refer to FIG. 4. In one embodiment, a force sensor includes a package substrate 33, a MEMS-based device, a package body 35 and a force touching member 36. The MEMS-based device is disposed on the package substrate 33 and electrically connected with the package substrate 33. In one embodiment, the MEMS-based device includes a first substrate 31 and a second substrate 32, wherein the first substrate 31 includes a fixed electrode 311, a first conductive contact 312 and a second conductive contact 313. In the embodiment shown in FIG. 4, the first substrate 31 has a plurality of metal layers, which are connected with each other by interconnection structures to form the desired circuit. A portion of the topmost metal layer is exposed on the surface of the first substrate 31 to function as the fixed electrode 311, the first conductive contact 312, and the second conductive contact 313. In one embodiment, the first substrate 31 includes a driver circuit and/or a sensing circuit. For example, the first substrate 31 may have an analog and/or digital circuit, which is normally realized by an Application Specific Integrated Circuit (ASIC). However, the present invention is not limited by the abovementioned embodiments. In one embodiment, the first substrate 31 is also called the electrode substrate. For example, the first substrate 31 may be a substrate having appropriate rigidity, such as a complementary metal oxide semiconductor (CMOS) substrate or a glass substrate.

The second substrate 32 has a first surface (i.e. the surface of the second substrate 32, which faces downward), a second surface opposite to the first surface, and a microelectromechanical system (MEMS) element 323. The second substrate 32 is disposed over the first substrate 31 with the first surface being faced to the first substrate 31 and electrically connected with the first conductive contact 312 of the first substrate 31. For example, at least one second connection member 321 of the second substrate 32 and a conductive material 322 on the terminal of the second connection member 321 are connected with the first conductive contact 312 of the first substrate 31. In one embodiment, the second substrate 32 is joined to the first substrate 31 in at least one of a eutectic bonding method, a fusion bond method, a soldering method and an adhesive method. The MEMS element 323 and the fixed electrode 311 are opposite to each other to form a sensing capacitor. It is easily understood: the movement of the MEMS element 323 with respect to the fixed electrode 311 would vary the capacitance of the sensing capacitor. Thus, a sensation signal is output. The force sensor of the present invention can determine whether the force sensor is pressed and the magnitude of the pressing force via measuring the variation of the capacitance of the sensing capacitor.

In one embodiment, the first substrate 31 further includes at least one reference electrode (not shown in the drawing), and the second substrate 32 further includes at least one reference element (not shown in the drawing); the reference electrode and the reference element are opposite to each other to form a reference capacitor. The persons having ordinary knowledge in the art would be able to undertake appropriate manipulation to make the reference capacitor and the sensing capacitor jointly form a differential capacitor pair, whereby to improve the precision of measurement.

The MEMS-based device, which is formed via joining the first substrate 31 with the second substrate 32, is disposed on the package substrate 33; a wire bonding process uses a lead 34 to electrically connect the second conductive contact 313 of the first substrate 31 with the package substrate 33; the package body 35 is used to encapsulate the MEMS-based device and the lead 34 for protecting the abovementioned elements. Thus, the MEMS-based device, which is encapsulated by the package body 35, can be electrically connected with the external device through the second conductive contact 313 of the first substrate 31 and at least one external conductive contact 331 of the package substrate 33.

Figure 5:
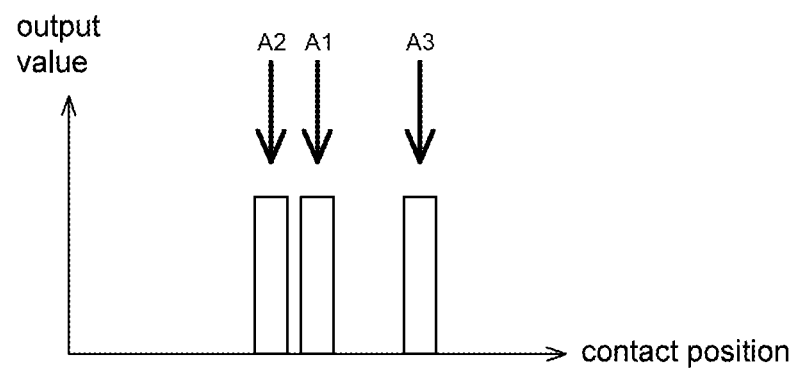
FIG. 5 is a diagram schematically showing the output signals corresponding to different contact positions of the force sensor of the present invention.
Figure 13:
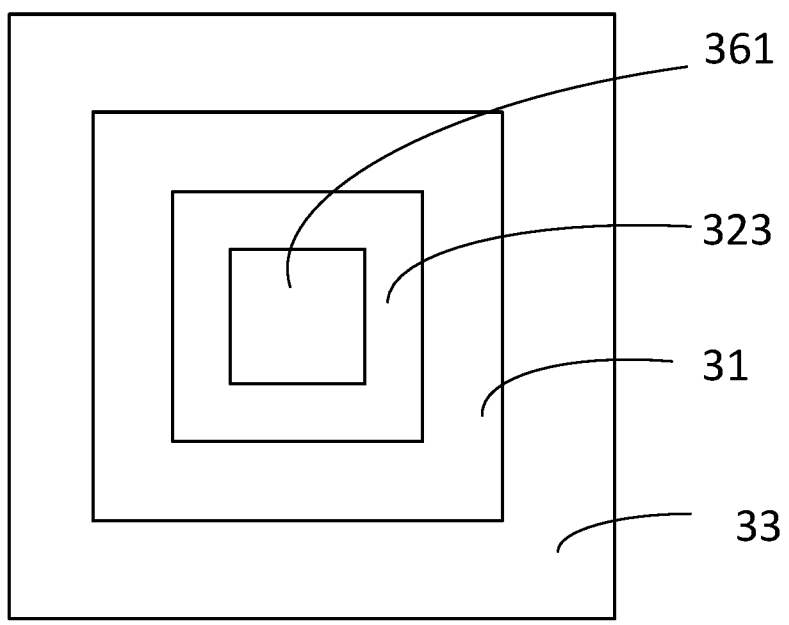
FIG. 13 is a diagram schematically showing the projection dimensions of the features illustrated in FIG. 4.

Refer to FIG. 4 and FIG. 13. The force touching member 36 is disposed on the package body 35 and sticking out of the package body 35. The force touching member 36 includes a single rod 361, which is corresponding to the MEMS-based device. For example, the single rod 361 of the force touching member 36 is corresponding to the MEMS element 323 and just right on the MEMS element 323. More specifically, the rod 361 of the force touching member 36 is corresponding to the deformable area of the MEMS element 323 and just right on the deformable area of the MEMS element 323. In one embodiment, the single rod 361 of the force touching member 36 is corresponding to the geometric center of the deformable area of the MEMS element 323. Refer to FIG. 4 and FIG. 5. Different assembly errors may result in different deviations, such as the pressing elements A1, A2 and A3 in FIG. 4. As the force touching member 36 is more sticking out than the package body 35 in the present invention, the pressing force is concentrated on the force touching member 36. Thus, the force sensor of the present invention can still output consistent sensation signals even though different assembly errors result in different deviations, as shown in FIG. 5.

Figure 6:
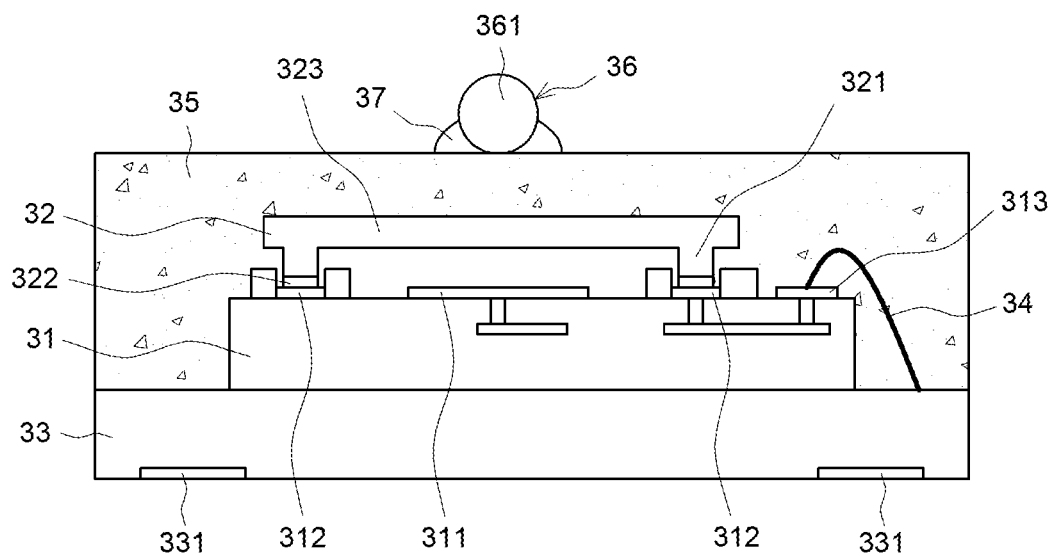
FIG. 6 is a diagram schematically showing a force sensor according to a second embodiment of the present invention.

In the embodiment shown in FIG. 4, the top surface of the rod 361 is a planar surface. However, the present invention is not limited by the embodiment. Refer to FIG. 6. In one embodiment, the top surface of the force touching member 36 is a curved surface. It is easily understood: the rod 361 may be stuck to the package body 35 by an adhesive material 37.

Figure 7:
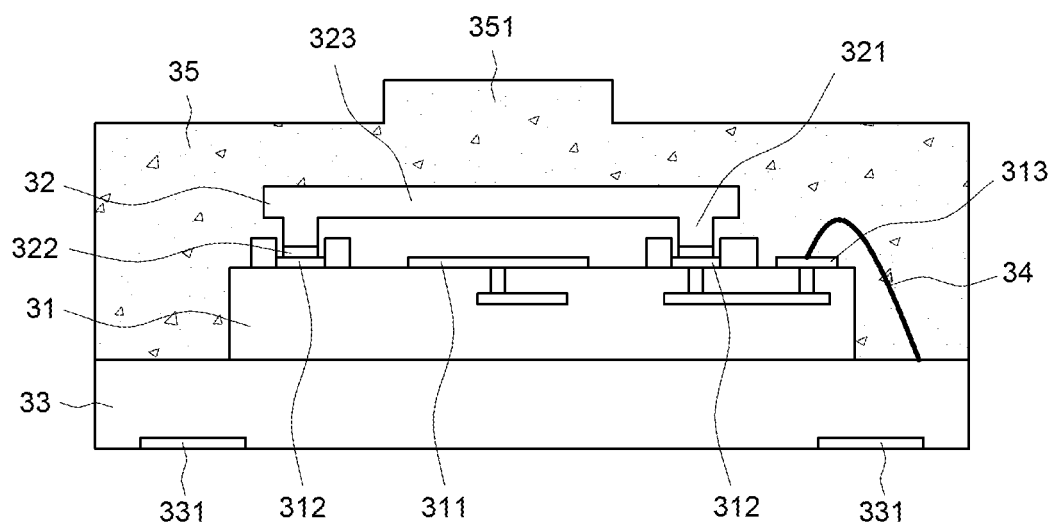
FIG. 7 is a diagram schematically showing a force sensor according to a third embodiment of the present invention.

Refer to FIG. 7. The force touching member may be an extension of the package body 35, such as the protruding portion 351 in FIG. 7. Similarly, the protruding portion 351 is corresponding to the MEMS-based device. More specifically, the protruding portion 351 is corresponding to the deformable area of the MEMS element 323 and just right on the deformable area of the MEMS element 323. In one embodiment, the protruding portion 351 is corresponding to the geometric center of the deformable area of the MEMS element 323.

Figure 8:
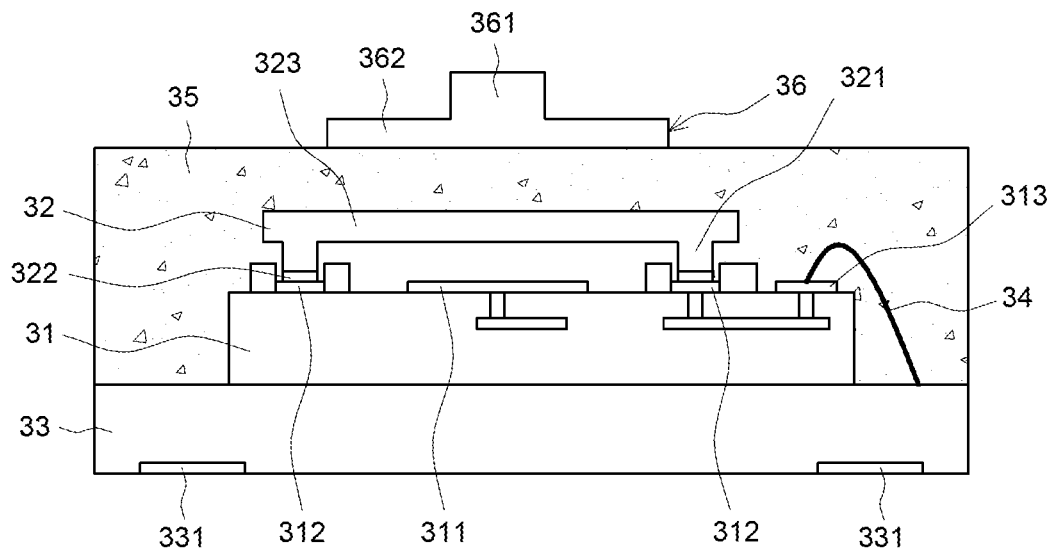
FIG. 8 is a diagram schematically showing a force sensor according to a fourth embodiment of the present invention.
Figure 9:
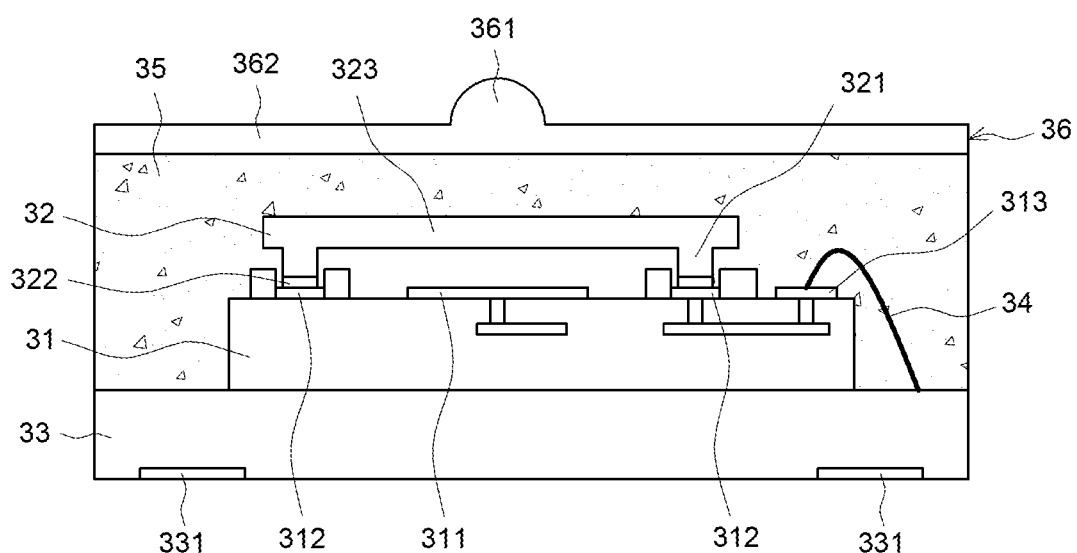
FIG. 9 is a diagram schematically showing a force sensor according to a fifth embodiment of the present invention.

Refer to FIG. 8. In one embodiment, the force touching member 36 includes a rod 361 and a plate 362, wherein the plate 362 is interposed between the rod 361 and the package body 35. In one embodiment, the force touching member 36 is an integral element. In other words, the rod 361 and the plate 362 are fabricated into a one-piece element. In one embodiment, the force touching member 36 is made of a metallic material. The projection area of the plate 362 may be equal to or smaller than the deformable area of the MEMS element 323. In the embodiment shown in FIG. 8, the plate 362 is corresponding to the deformable area the MEMS element 323. Refer to FIG. 9. In one embodiment, the projection area of the plate 362 is larger than the MEMS-based device and covers the upper surface of the package body 35. Similarly, the top surface of the rod 361 may be a planar surface (as shown in FIG. 8) or a curved surface (as shown in FIG. 9). It should be explained: the measurement range of the force sensor of the present invention, such as a measurement range of up to 10 Newtons or 100 Newtons, can be adjusted via modifying the thickness of the MEMS element 323 or modifying the thickness/material of the package body 35; the measurement range of the force sensor of the present invention can be also controlled via modifying the thickness of the plate 323.

Figure 10:
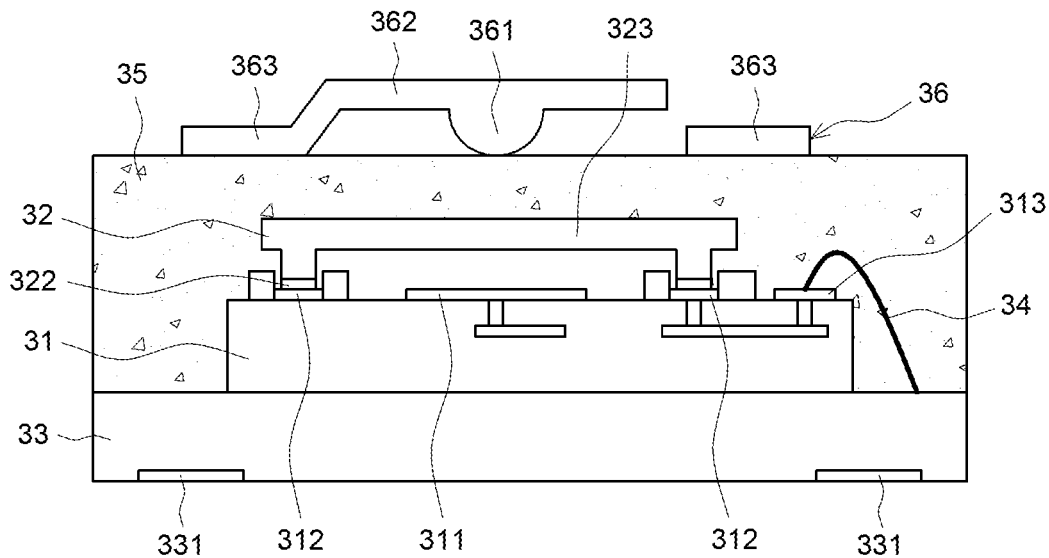
FIG. 10 is a diagram schematically showing a force sensor according to a sixth embodiment of the present invention.
Figure 11:
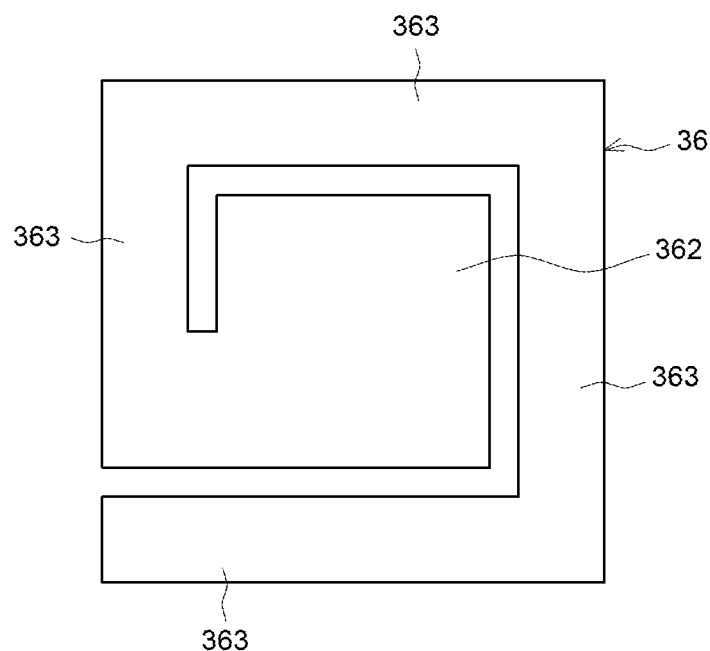
FIG. 11 is a top view schematically showing a force touching member of the force sensor according to the sixth embodiment of the present invention.

Refer to FIG. 10 and FIG. 11. In one embodiment, the plate 362 may be disposed above the rod 361. In other words, the rod 361 is interposed between the plate 362 and the package body 35. Thereby, while the plate 362 is pressed, the stress is concentrated on the rod 361. Thus, the assembly tolerance allowed by the present invention can be further increased. In one embodiment, the plate 362 further includes at least one connection leg 363, which is connected to the package body 35, whereby to prevent the plate 362 from being tilted during pressing.

Figure 12:
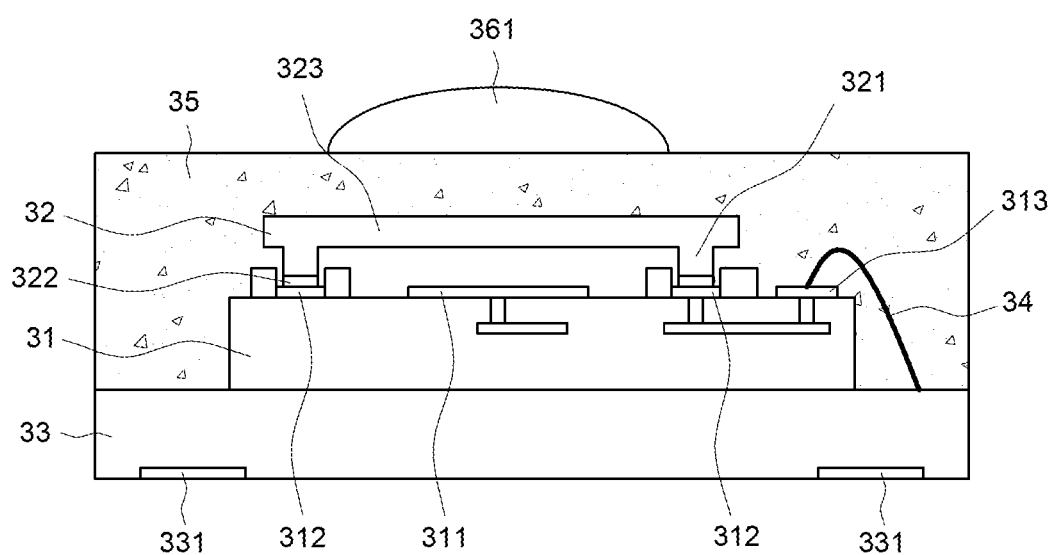
FIG. 12 is a diagram schematically showing a force sensor according to a seventh embodiment of the present invention.

Refer to FIG. 12. In one embodiment, the rod 361 may be formed via dispensing a resin on the package body 35. It is easily understood: the rod 361 is made of a polymeric material in this embodiment.

In conclusion, the present invention is characterized in that a force touching member is disposed on the package body corresponding to the MEMS-based device and that the contact of the pressing element and the force touching member makes the force, which is originally applied to the pressing element, be concentrated on the force touching member. Such a structure enables the force sensor of the present invention to allow a greater assembly tolerance. The force touching member may include a plate. The measurement range of the force sensor of the present invention can be controlled via modifying the thickness of the plate.

The embodiments have been described above to demonstrate the technical thoughts and characteristics of the present invention to make the persons skilled in the art to understand, make, and use the present invention. However, these embodiments are not intended to limit the scope of the present invention. Any equivalent modification or variation according to the spirit of the present invention is to be also included by the scope of the present invention.

What is claimed is:

1. A force sensor with a force touching member, comprising:
   a package substrate;
   a microelectromechanical system (MEMS)-based device disposed on the package substrate and electrically connected with the package substrate, wherein the MEMS-based device includes a MEMS element providing a deformable area; and
   a package body encapsulating the MEMS-based device, wherein the force touching member includes a rod for pressing disposed on the package body and the rod corresponds to a geometric center of the deformable area of the MEMS element of the MEMS-based device, and
   wherein the package body is filled between the rod and the deformable area.

2. The force sensor with a force touching member according to claim 1, wherein a top surface of the rod is a planar surface or a curved surface.

3. The force sensor with a force touching member according to claim 1, wherein the rod is made of a metallic material or a polymeric material.

4. The force sensor with a force touching member according to claim 1, wherein the rod has a plate interposed between the rod and the package body or disposed on the rod.

5. The force sensor with a force touching member according to claim 4, wherein a projection area of the plate is equal to or smaller than the MEMS-based device.

6. The force sensor with a force touching member according to claim 4, wherein the plate is interposed between the rod and the package body and covers the package body.

7. The force sensor with a force touching member according to claim 4, wherein the plate is disposed on the rod and has a connection leg, which is connected to the package body.

8. The force sensor with a force touching member according to claim 1, wherein the force touching member is an extension of the package body.

* * * * *